United States Patent

Tavallaei et al.

[11] Patent Number: 6,101,459
[45] Date of Patent: Aug. 8, 2000

[54] SYSTEM AND ASSOCIATED METHOD FOR COOLING COMPONENTS WITHIN A COMPUTER SYSTEM

[75] Inventors: Siamak Tavallaei; An T. Vu, both of Spring; Thomas T. Hardt, Missouri City; Wade D. Vinson, Spring; John S. Lacombe, Tomball; James A. Mouton, Cypress, all of Tex.

[73] Assignee: Compaq Computer Corporation, Houston, Tex.

[21] Appl. No.: 08/912,293

[22] Filed: Aug. 15, 1997

[51] Int. Cl.[7] .......................................................... H05K 7/20
[52] U.S. Cl. ........................................... 702/132; 702/130
[58] Field of Search ..................................... 702/130, 132; 713/324; 361/695

[56] References Cited

U.S. PATENT DOCUMENTS

| | | | |
|---|---|---|---|
| 4,570,918 | 2/1986 | Eisler | 271/3.1 |
| 5,471,099 | 11/1995 | Larabell et al. | 307/53 |
| 5,546,272 | 8/1996 | Moss et al. | 361/687 |
| 5,590,061 | 12/1996 | Hollowell, II et al. | 364/571.03 |
| 5,680,295 | 10/1997 | Le et al. | 361/695 |
| 5,726,874 | 3/1998 | Liang | 363/141 |
| 5,815,652 | 9/1998 | Ote et al. | 395/183.07 |
| 5,835,786 | 11/1998 | Brown et al. | 395/835 |

*Primary Examiner*—Timothy P. Callahan
*Assistant Examiner*—Linh Nguyen

[57] ABSTRACT

A cooling system for a high-end server includes four hot-pluggable fans plugged into a fan control board. The fans are arranged in two groups, with each group having two fans, one behind the other. One of the groups of fans is used to cool the processor boards and the other group is used to cool the system I/O board slots. Under normal operation, only one fan from each group is active, while the other fan freewheels, providing redundancy. A fan control board delivers power to each of the fans and further provides a signal, responsive to temperature sensors, to each of the fans to control their speeds. Each of the fans provides a fan fault signal and a fan not present signal to the fan control board. The temperature sensors are placed proximate the processors and I/O components to monitor the operating temperatures thereof, and communicate the respective temperatures back to the fan control board, via $I^2C$ bus. An operating system is utilized to drive the fan controller but can be overridden by the fan controller during critical conditions. An air ramp is positioned between the processors to help direct the flow of air generated by the fans onto some of the processors. Additionally, each of the fans are configured with a quick installment device to facilitate single-hand insertion and removal of the fans from the computer system.

22 Claims, 6 Drawing Sheets

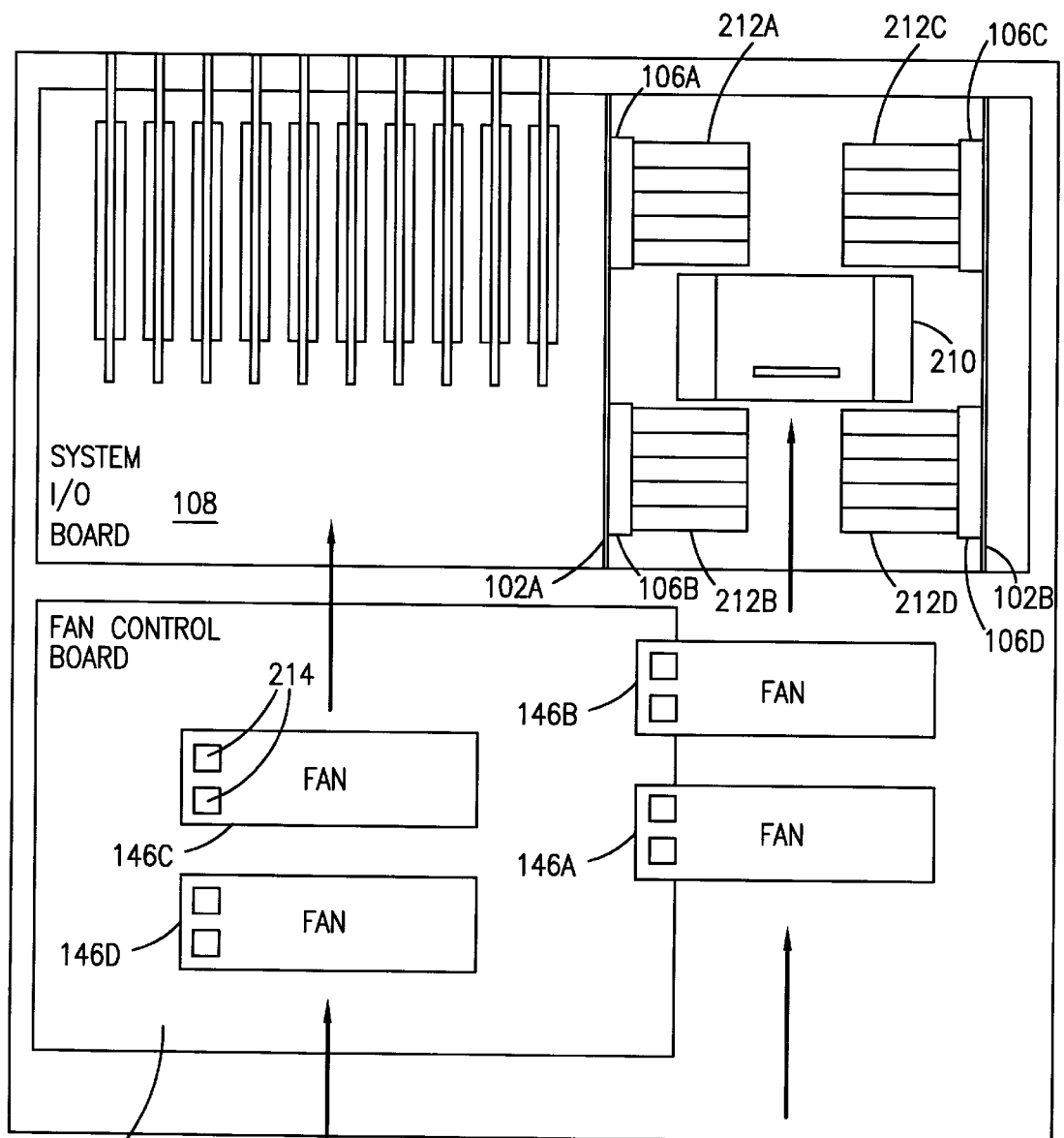
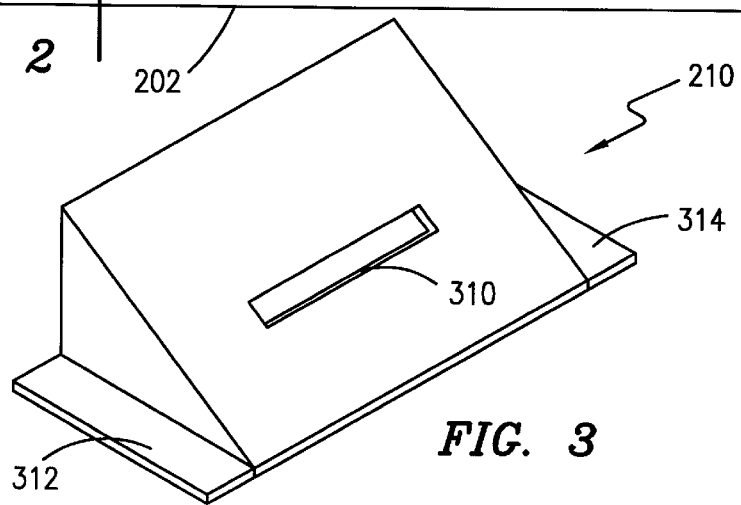
FIG. 2
FIG. 3

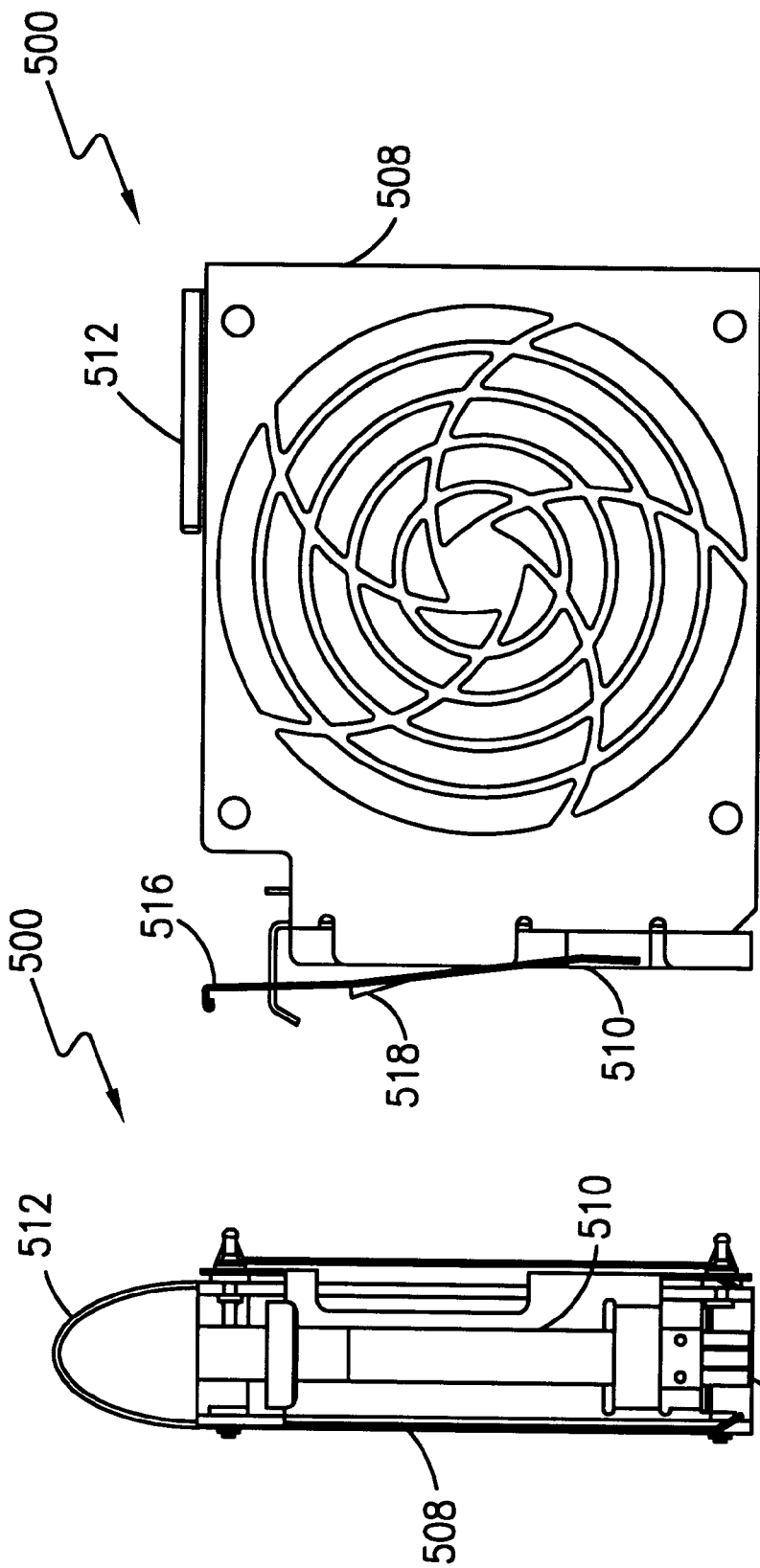

SYSTEM AND ASSOCIATED METHOD FOR COOLING COMPONENTS WITHIN A COMPUTER SYSTEM

BACKGROUND OF THE INVENTION

1. Field of the Invention

The present invention relates to computer systems, and more particularly, but not by way of limitation, to a cooling system and associated method for cooling components within the computer system, with the cooling system having redundant, variable speed, responsive temperature, hot-pluggable cooling fans, and an air ramp for directing the air flow created by the cooling fans onto selected elements.

2. Description of Related Art

Networks serve the purpose of connecting many different personal computers (PCs), workstations, or terminals to each other, and to one or more host computers, printers, file servers etc., so that expensive computing assets, programs, files and other data may be shared among many users.

In a network utilizing a client/server architecture, the client (personal computer or workstation) is the requesting machine and the server is the supplying machine, both of which may preferably be connected via the network, such as a local area network (LAN), wide area network (WAN) or metropolitan area network (MAN). This is in contrast to early network systems that utilized a mainframe with dedicated terminals.

In a client/server network, the client typically contains a user interface and may perform some or all of the application processing and, as mentioned above, can include personal computer or workstations. The server in a client/server network can be a high-speed microcomputer or minicomputer and in the case of a high-end server can include multiple processors and mass data storage such as multiple CD-ROM drives and multiple hard drives, preferably with redundant array of inexpensive disk (RAID) protection. An exemplary server such as a database server maintains the databases and processes requests from the client to extract data from or update the database. An application server provides additional business processing for the clients. The network operating system (NOS) together with the database management system (DBMS) and transaction monitor (TP monitor) are responsible for the integrity and security of the server.

Client/server networks are widely used throughout many different industries and business organizations, especially where mission-critical applications requiring high performance are routinely launched. The mass storage and multi-processing capabilities provided by current client/server network systems (for example, the high-end servers) that run such applications permit a wide range of essential services and functions to be provided through their use.

As can be appreciated, many businesses are highly dependent upon the availability of their client/server network systems to permit essential network services and functions to be carried out. As client/server network systems become increasingly essential to the everyday operations of such businesses, additional steps need to been taken in the design and construction of the server in the client/server network system to ensure its continuous availability to the clients. That is to say, in the design and construction of a server, steps need to be taken to ensure that the server can be operated with little or no downtime.

It can be appreciated by those skilled in the art that high availability, reliability and serviceability are valuable design aspects in ensuring that a server is a "zero downtime" system that will operate with little or no downtime. The modularity of components within a server has been recognized as an important design consideration in ensuring that the downtime of a server will be minimized. Modules can be removed and examined for operability or other purposes much easier than permanently mounted fixtures within a server chassis. When various components of a server can be provided in a modular form, they can also be readily replaced to maintain the operational status of the server with minimal downtime.

Removable modular components may include disc drives and power supplies. As described above, the removability of modular components allows for better overall serviceability of the computer system which is a distinct advantage. For example, a defective power supply in the server generally requires prompt replacement in order to limit downtime. Modular components and connectors facilitate prompt replacement and are thus popular in many computer designs.

Originally, a rule of practice in the maintenance of modular components or printed circuit boards of a server was that of turning the power to the server off before any modular components or printed circuit boards were removed from or added to the chassis or support frame of the server. Recent innovations have centered around a highly desirable design goal of "hot-pluggability" which addresses the benefits derived from inserting and removing modular components and printed cards from the chassis of the server when the server is electrically connected and operational. It can be readily appreciated that modularization and hot-pluggability can have a significant bearing on the high availability aspect of a high-end server.

Hot-pluggable components may include storage or disc drives, drive cages, fans, power supplies, system I/O boards, control boards, processor boards, and other sub-assemblies. The ability to remove these constituent components without having to power down the server allows for better overall serviceability of the system, which is a distinct advantage to both the user and the maintenance technician.

Component redundancy has also been recognized as an important design consideration in ensuring that a server will operate with little or no downtime. Essentially, component redundancy is typically provided in a system to better ensure that at least one of the redundant components is operable, thereby minimizing the system down time. With component redundancy, at least two components are provided that can perform the same function, such that if one of the components becomes faulty for some reason, the operation fails over to the redundant component. When at least one of the redundant components is operable, continued operation of the computer system is possible even if others of the redundant components fail. To further enhance reliability and serviceability, redundant components have been made hot pluggable.

Dynamic reconfiguration of a server system can also be accomplished by providing upgradable modular components therein. As can be readily appreciated, this objective can be accomplished by the addition or substitution of components having different circuits, preferably updated or upgraded, disposed therewithin. When components are redundant and hot pluggable, reconfiguration of the server is often possible without taking the server offline.

Another important design aspect with respect to providing redundant and hot pluggable components in a server system is to ensure and maintain a safe working environment while the server is operating and being repaired or upgraded. Accordingly, when the system components are swapped or upgraded, the exposure of hot connectors and contacts must be kept to a minimum. It can be appreciated by those skilled in the art that further developments in this area would significantly enhance the reliability and serviceability aspects of a highend server system.

To further enhance the serviceability of server systems, additional innovations may be required in the design and construction of diagnostic subsystems thereof. In existing client/server network systems it is often difficult to obtain, in a timely manner, important diagnostic data and information corresponding to a component failure in order to facilitate the quick serviceability of the server. Therefore, it can be appreciated that the more information that can be readily provided to locate a defective component or problem with the server, the better the optimization of the amount of time the server is up and running.

Although the cooling of computer systems has always been a concern with computer designers to maintain high availability, the form factor of the chassis and the high demands for improved reliability of the client/server network systems with ever-increasing microprocessor power dissipation and system power consumption have created additional problems with cooling system design, especially in temperature monitoring and temperature control. In fact, many of the new computer processors have been designed to include a heat sink to help dissipate the generated heat. Not only are the high end servers utilizing the newer high powered processors, but are also utilizing multiple processors therein creating even more heat within the system. One proposed solution was to just use higher speed cooling fans, however the higher speed fans created increased noise levels of operation.

Therefore, as can be appreciated, there is a need for a cooling system in a computer system that produces high efficiency cooling, minimizes system down time, and yet maintains a low noise level during operation.

SUMMARY OF THE INVENTION

The present invention overcomes the above identified problems as well as other shortcomings and deficiencies of existing technologies by providing a cooling system and associated method for cooling components within the computer system, with the cooling system having redundant, variable speed, temperature responsive, hot-pluggable cooling fans which are programmed to operated at an optimized high speed/low noise ratio, and an air ramp for directing the air flow created by the cooling fans onto selected elements within the cooling system.

The present invention further provides a cooling system having four hot-pluggable fans plugged into a fan control board. The fans are arranged in two groups, with each group having two fans, one behind the other. One of the groups of fans is used to cool the processor boards and the other group to cool the system I/O board slots. Under normal operation, only one fan from each group is active, while the other fan freewheels, providing redundancy. A fan control board delivers power to each of the fans receive power and further provides a signal to each of the fans to control their speeds. Each of the fans provides a fan fault signal and a fan not present signal to the fan control board. Temperature sensors are placed proximate the processors and I/O components and communicate the respective temperatures back to the fan control board, via I²C bus. The operating system is utilized to drive the fan controller but can be overridden by processors in the fan controller during critical operating conditions. During operation, if one of the active fans fails, the redundant fan is turned on. After the redundant fan stabilizes and is determined to be fully operational, the failed fan is shut down. If the operating system detects that both the primary and redundant fan have failed both fans are maintained in the on position until the operating system can perform a graceful shut-down of the system. Similarly, if it is detected that both the primary fan and the redundant fan have been removed from the computer system, the operating system will also perform a graceful shut-down of the computer system.

An air ramp is positioned between the processors to help direct the flow of air generated by the fans onto some of the processors.

Additionally, each of the fans are configured with installment aids to facilitate quick and safe single hand insertion and removal of the fans from the computer system.

BRIEF DESCRIPTION OF THE DRAWINGS

A more complete understanding of the present invention may be had by reference to the following Detailed Description and appended claims when taken in conjunction with the accompanying Drawings wherein:

FIG. 2 is a block diagram illustrating a computer system utilizing the present invention;

FIG. 3 is a perspective view of an air ramp in accordance with the principles of the present invention;

FIG. 5 is a side view of a fan unit in accordance with the principles of the present invention;

FIG. 6 is a frontal view of a fan unit as similarly shown in FIG. 5;

DETAILED DESCRIPTION

Figure 1:
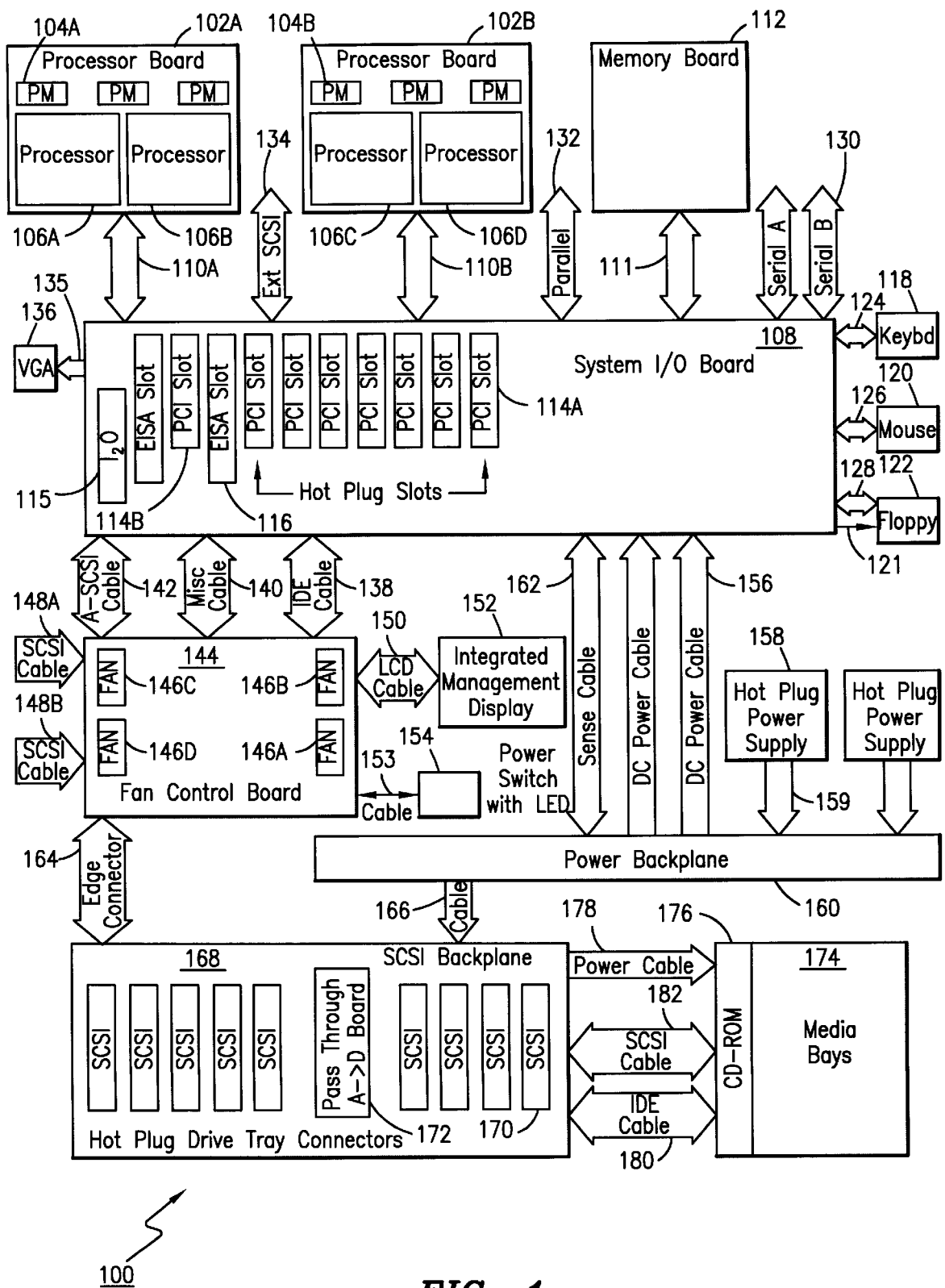
FIG. 1 is a board-level block diagram illustrating an exemplary embodiment of a computer system in which the teachings of the present invention may be utilized.

Referring now to the drawings wherein like or similar elements are designated with identical reference numerals throughout the several views, and wherein the various elements depicted are not necessarily drawn to scale, and, in particular, to FIG. 1, there is shown a board-level block diagram of a presently preferred exemplary computer system 100 in which the teachings of the present invention may be beneficially employed. The exemplary computer system 100 may comprise multiple processor boards, for example, processor boards 102A and 102B, each of which, in turn, may include a plurality of processors such as, for example, processors 106A and 106B. The processor boards 102A and 102B may also include, respectively, multiple power modules, such as power modules 104A and 104B which are shown herein.

Each of the processor boards 102A and 102B is connected to a system board 108 via a suitable bus connector or slot, for example, bus connector slots 110A and 110B, respectively. In the exemplary computer system 100, the presently preferred bus connector slots are compatible with the Gunning Transistor Logic (GTL) bus protocol. Furthermore, as will be seen hereinbelow, the system board 108 in the exemplary embodiment also includes multiple input/output (I/O) subsystems. Accordingly, the system board 108 may also be interchangeably referred to as the system I/O board in the following Detailed Description.

Continuing to refer to FIG. 1, a memory board 112 is also coupled to the system board 108 through a memory connection slot 111. In the exemplary computer system 100, the memory board 112 may comprise several dual in-line memory modules (DIMMs) having known sizes, for example, 8 MB, 16 MB, 32 MB, 64 MB, 128 MB, and 256 MB. As can be appreciated by those skilled in the art, the memory provided with the memory board 112 may be organized in any known fashion.

The exemplary system board 108 includes multiple expansion slots, suitable for different bus types. Further, these expansion slots may be selectively provided with "hot-pluggable" capability. One of ordinary skill in the art can readily appreciate that the ability to replace an expansion card (not shown), receivable at an expansion slot, without powering down the system 100 contributes to rendering the system 100 a "zero downtime" system with high availability. In the exemplary computer system 100, the multiple expansion slots comprises those that may be operable with the Peripheral Component Interconnect (PCI) bus type (for example, slots 114A and 114B) as well as those slots that are compatible with the Extended Industry Standard Architecture (EISA) bus type (for example, slot 116). It should be appreciated that either categories of the expansion slots may be provided with hot-pluggability. The system board 108 may additionally comprise serial port connections, for example, serial connector 130, parallel port connections, for example, parallel connector 132, and a connector 134 compatible with the Small Computer System Interface (SCSI) bus type.

Still continuing to refer to FIG. 1, the system board 108 is coupled to a host of input and output devices via cables, for example, a keyboard 118 with cable 124, a pointing device 120 with cable 126, a flexible disk drive 122 with cable 128, and a monitor 136 with cable 135. As can be seen, a separate power connection path 121 is also provided between the flexible disk drive 122 and the system board 108.

The exemplary system board 108 may also comprise an "intelligent I/O" ($I_2O$) bus connector 115 for accelerating the performance of selected PCI-compatible expansion slots. A fan control board 144 is coupled to the system board 108 through a SCSI cable 142, a miscellaneous cable 140 and an Integrated Drive Electronics (IDE) cable 138. The fan control board 144 includes multiple fan connectors, for example, fan connector 146A–146D, which fan connectors are used for coupling hot-pluggable fans. The fan control board 144 may be provided with additional SCSI-compatible cables, for example, cables 148A and 148B, a display cable 150 coupled to an integrated management display (IMD) unit 152, and a power switch cable 153 coupled to a power switch 154.

The miscellaneous cable connector 140, which joins the fan control board 144 with the system board 108, preferably contains signals generated by the IMD unit 152, various interlock signals provided by an interlock cabling system (not shown) interconnecting various boards, temperature signals, fan control signals, audio signals, et cetera.

Still referring to FIG. 1, the system board 108 of the exemplary computer system 100 is coupled to a power backplane 160 via a sense cable 162 and at least one DC power cable 156. Redundant hot pluggable power supply units 158 are connected to the power backplane 160 through hot plug power connectors 159. Both the fan control board 144 and the power backplane 160 are coupled to a SCSI backplane 168 via an edge connector 164 and a power-SCSI backplane cable 166, respectively. The SCSI backplane includes multiple SCSI drive tray connectors, for example tray connector 170. In the exemplary computer system 100, the SCSI drive tray connectors are also provided with the hot plug capability in order to enhance the high availability aspect thereof A media power cable 178 connects the SCSI backplane 168 to a media bay 174 and CD-ROM drive 176. A media SCSI cable 182 and an IDE cable 180 are also disposed between the SCSI backplane and the CD-ROM/media bay 176/174.

Referring now to FIG. 2, there is illustrated a computer system as similarly shown in FIG. 1 within a housing 202. As depicted the computer system includes a cooling system in accordance with the principles of the present invention. The cooling system includes hot-pluggable fans 146A, 146B, 146C, and 146D, each being mounted to the fan control board 144 (a more detailed description of the fans are given herein below with reference to FIGS. 5 and 6). Fans 146C and 146D are used to cool the electronics and peripheral components on the system I/O board 108, while fans 146A and 146B are used to cool the processors on processor boards 102A and 102B. During normal operating conditions of the computer system, fans 146C and 146B are operated to create an air flow over the I/O components and processors respectively, i.e. fans 146C and 146B are the primary fans. During normal operating conditions, fans 146D and 146A freewheel and are used as the redundant fans, and are activated by the fan control board 144 when needed. Each of the fans receives power from the fan control board 144. During operation, if fan control board 144 detects that fan 146C is faulty, fan control board 144 will shut down fan 146C and activate 146D. Similarly, during operation if fan control board 144 detects that fan 146B is faulty, fan control board 144 will shut down fan 146B and activate 146A (a more detailed operation of the operation of fan control board 144 is given herein below). Fans 146A–146D are also hot-pluggable, i.e. can be removed and installed without powering down the system. In addition, the speed of fans 146A–146D is also controlled by fan control board 144 in response to changes in temperature in the computer system as monitored by temperature sensors (see FIG. 4). Good results have been achieved by operating the fans at two speeds. A low speed which has been optimized for cooling/low noise, and high speed, optimized for cooling.

Still referring to FIG. 2, an air ramp 210 is positioned near processors 106A and 106C to help direct or concentrate the air flow generated by fans 146A and 146B through the heat sinks 212A and 212C of processors 106A and 106C. During operation, the air flow created by fans 146A and 146B would pass through heat sinks 212B and 212D on processors 106B and 106D, respectively, and provide adequate cooling thereof However, it was determined that a majority of the air flow exiting hit sinks 212B and 212D would bypass heat sinks 212A and 212C and not provide sufficient cooling. Therefore, air ramp 210 is used to redirect or concentrate the air flow through heat sinks 212A and 212C thereby providing sufficient cooling of processors 106A and 106C.

As further illustrated in FIG. 2, each fan includes two indicators, such as indicators 214. In an exemplary embodiment the indicators are two different colored LEDs, with one of the indicators used to indicate that the fan is receiving power and is operational, the other to indicate that the fan is receiving power but has encountered a fault condition. The fault indication light will remain lit until the corresponding fan has been removed for service, whereupon the indicator lights reset.

Referring now to FIG. 3, there is illustrated a perspective view of air ramp 210. As depicted air ramp 210 is generally wedged shaped and includes a slot 310 near the base. Slot 3 10 permits a selected amount of air flow to pass through air ramp 210 to provide air flow across any electronic components on the printed circuit board to which processor boards 102A and 102B are attached. Air ramp 210 further includes tabs or flanges 312 and 314 which are used to secure the air ramp 210 within the computer system.

Figure 4:
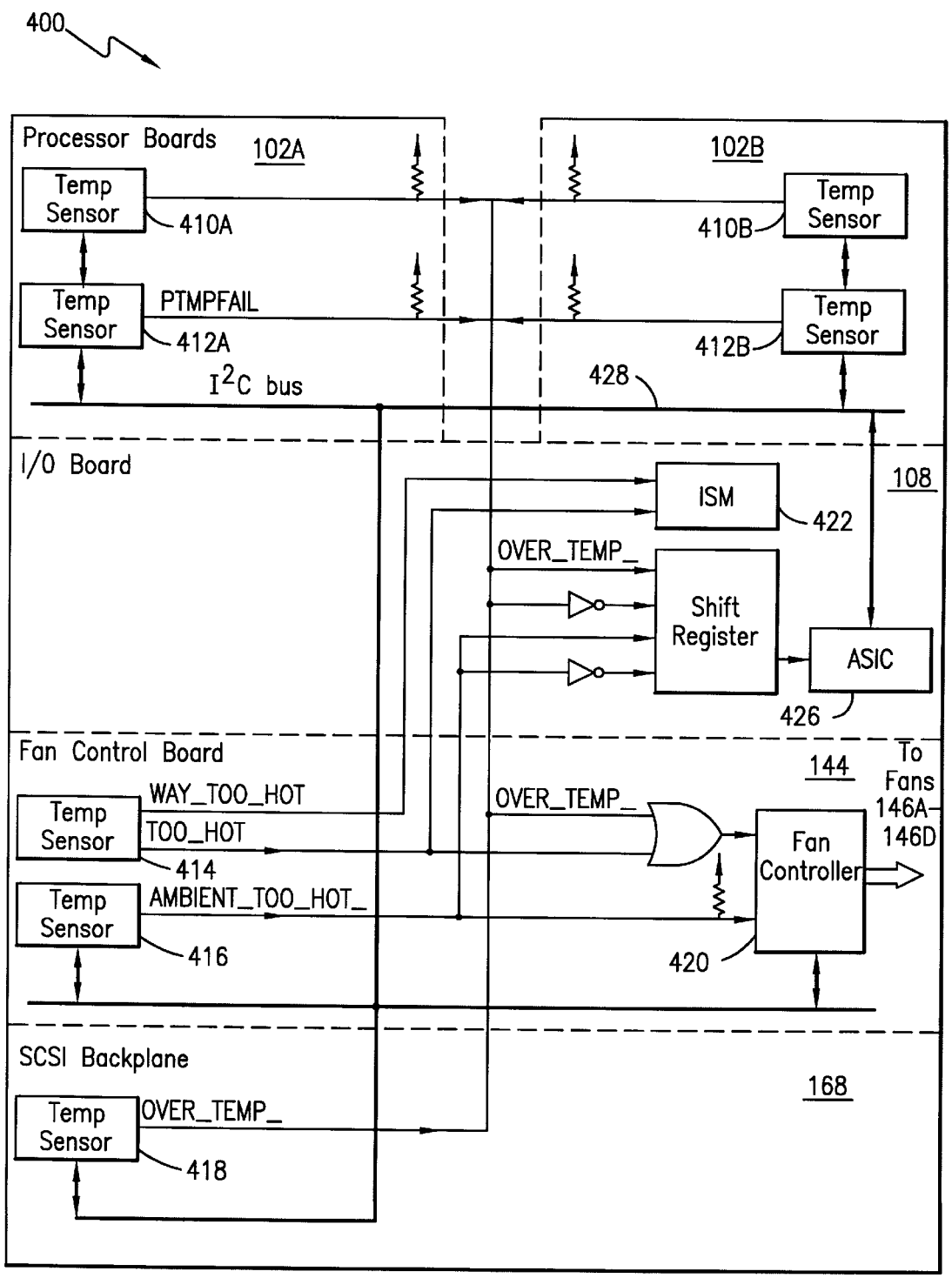
FIG. 4 is a functional block diagram on an exemplary embodiment of the present invention.

Referring now to FIG. 4, there is illustrated a block diagram of temperature monitoring system 400 in accordance with the principles of the present invention. As depicted, temperature monitoring system 400 includes temperature sensors 410A, 410B, 412A, 412B, 414, 416 and 418 and a fan controller 420. As illustrated temperature sensors 410A and 412A are positioned on processor board 102A. Temperature sensors 410B and 412B are positioned on processor board 102B. Temperature sensors 410A, 412A, 410B and 412B are primarily used to monitor the operating temperatures of processors on processor board 102A and 102B respectively. Temperature sensors 414 and 416 are positioned on the fan controller board 144 near system I/O board 108 and are primarily used to monitor the operating temperatures of the I/O components of system I/O board 108. Temperature sensors 410–416 communicate to the operating system and the fan controller 420 over an I²C bus 428.

Still referring to FIG. 4, fan controller 420 provides fan speed control for fans 146A–146D in response to the information received from temperature sensors 410–416, and further utilizes fault sensing circuitry to detect over current, under current, and rotor lock for fans 146A–146D. In operation, a pulse width modulated signal is generated by fan controller 420, responsive to temperature sensors 410–416, and is sent to the current operating fans (the I/O fan and the processors fan) to control the speeds thereof. If an over temperature condition is detected by temperature sensor 414 on fan control board 144, or by one of the temperature sensors on the processor boards, or by the temperature sensor on the SCSI backplane 168, fan controller 420 will force all operating fans to operate at full speed without operating system intervention.

Still referring to FIG. 4, fan controller 420 utilizes a current sensor to monitor the current draw of the operating fans, such as the primary fans 146C and 146B. If fan controller 420 detects a current draw by one of the operating fans that is an out-of-range condition, fan controller 420 will turn on the redundant fan in the group and after the redundant fan stabilizes, fan controller 420 will turn off the fan that was detected as having an out-of range current. If fan controller 420 detects an out-of-range current condition for both the primary fan and the redundant fan, the fan controller will leave both fans operating. The system BIOS sets the initial fan speed with data sent through ASIC 426. ASIC 426 then passes the initial fan speed through the I²C bus 428 to the fan controller 420.

During operation of the fans, fan controller 420 is controlled by the operating system of the computer system, and in an exemplary embodiment the fans operate at two speeds, low and high. However, it is further contemplated that the operating system could provide a variance control to the user or the computer system so that the speed of the fans could be varied at a high resolution. Also, it is contemplated that the operating system could gradually increase and decrease the speeds of the fans in response to data received from the temperature sensors.

Although the operating system controls the fan controller 420 during normal operating conditions, when a critical condition is encountered, such as when the temperature rises above a select temperature for some reason, and the operating system does not increase the speed of the fan, the fan controller can by-pass the operating system and modify the speeds of the fans accordingly.

Referring now to FIGS. 5 and 6, there is illustrated an exemplary embodiment of a hot-pluggable fan unit 500 in accordance with the principles of the present invention. As illustrated fan unit 500 includes a typical fan body 508; an attachment mechanism 510; a rotatable grip 512; and a fan controller interface plug 514. Rotatable grip 512 is a single strip of nylon that has been rotatably attached to fan body 508. The attachment mechanism 510 includes a finger release spring lever 516 with an interlock 518 that engages a portion of the computer housing upon insertion of the fan therein. As described hereinabove, the fan units are hot-pluggable, and with hot-pluggable components, safety is an important feature. Therefore it is important to be able to install and remove the fan units readily and safely. Finger release spring lever 516 used in conjunction with grip 512 facilitates single hand installation and removal of the fan unit.

In operation, grip 512 is rotated away from fan body 508 (as shown in FIG. 5), whereby the user inserts fingers therein, such as an index and middle finger, and reaches the thumb of the same hand to engage spring lever 516. The fan unit 500 is then inserted into the corresponding anchor receptacle located on the fan control board (not shown). Interlock 518 prevents the fan from being removed without depressing spring lever 516. To remove the fan unit, the fingers are again inserted into grip 512 and spring lever 516 is depressed with the thumb, releasing interlock 518 from the corresponding anchor receptacle.

Still referring to FIGS. 5 and 6, upon installation of fan unit 500, fan controller interface plug 514 is received into a corresponding fan controller interface receptacle located on the fan control board. The fan controller interface plug 514 communicates to the fan controller 420 (see FIG. 4) a fan fault signal, and a fan not present signal, and also receives the power to drive the fan from the fan controller board 144.

Figure 7:
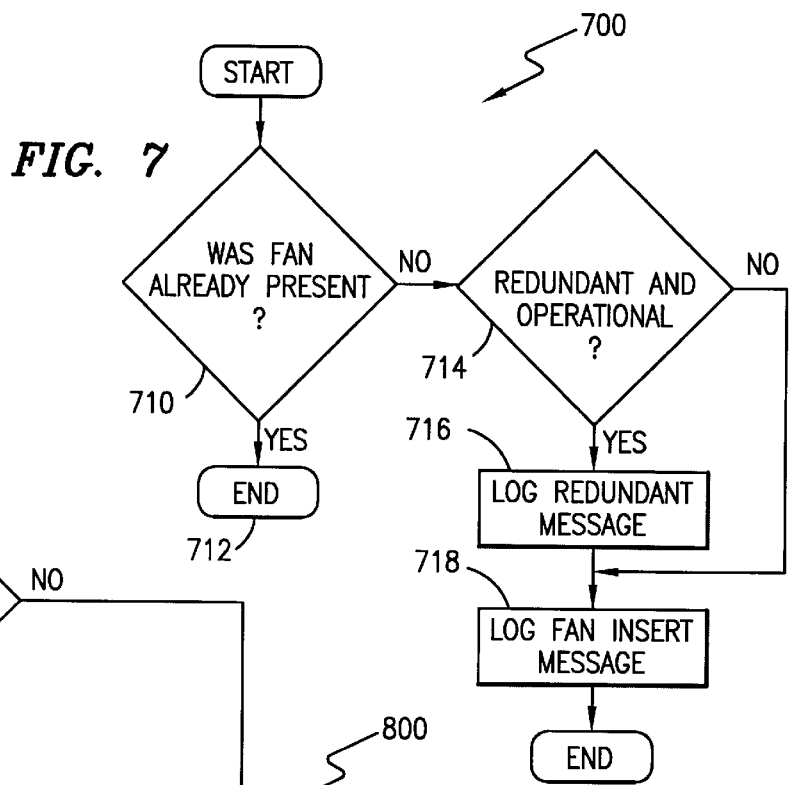
FIG. 7 is a flow chart illustrating the steps performed by the operating system upon the insertion of a fan unit into a computer system utilizing the present invention.

Referring now to FIG. 7, there is illustrated a flow chart 700 illustrating the steps performed by the operating system in communication with the fan control board 144 to check for and identify the insertion of a fan into the computer system. This procedure is run at selected time intervals to check each of the fan slots for a fan insertion. Additionally, the procedure can be initiated by an interrupt generated by the fan when inserted into the system. At the beginning of the procedure, as indicated by decision block 710, if the fan of interest was already present the last time the procedure was executed, the 'yes' path is taken to step 712 and the procedure ends. If, however, the fan of interest was not present the last time the procedure was executed, the 'no' path is followed to step 714, whereby a determination is made whether the inserted fan is the redundant/secondary fan. If the fan is the redundant/secondary fan, the 'yes' path is followed and a log redundant message is generated, indicating to the system that both fans are present and the procedure continues on to step 718. Referring back to step 714, if a determination is made that the fan is not the redundant fan, then the 'no' path is followed directly to step 718 where a log fan insert message is generated to indicate to the system a fan has been inserted into the computer system.

Figure 8:
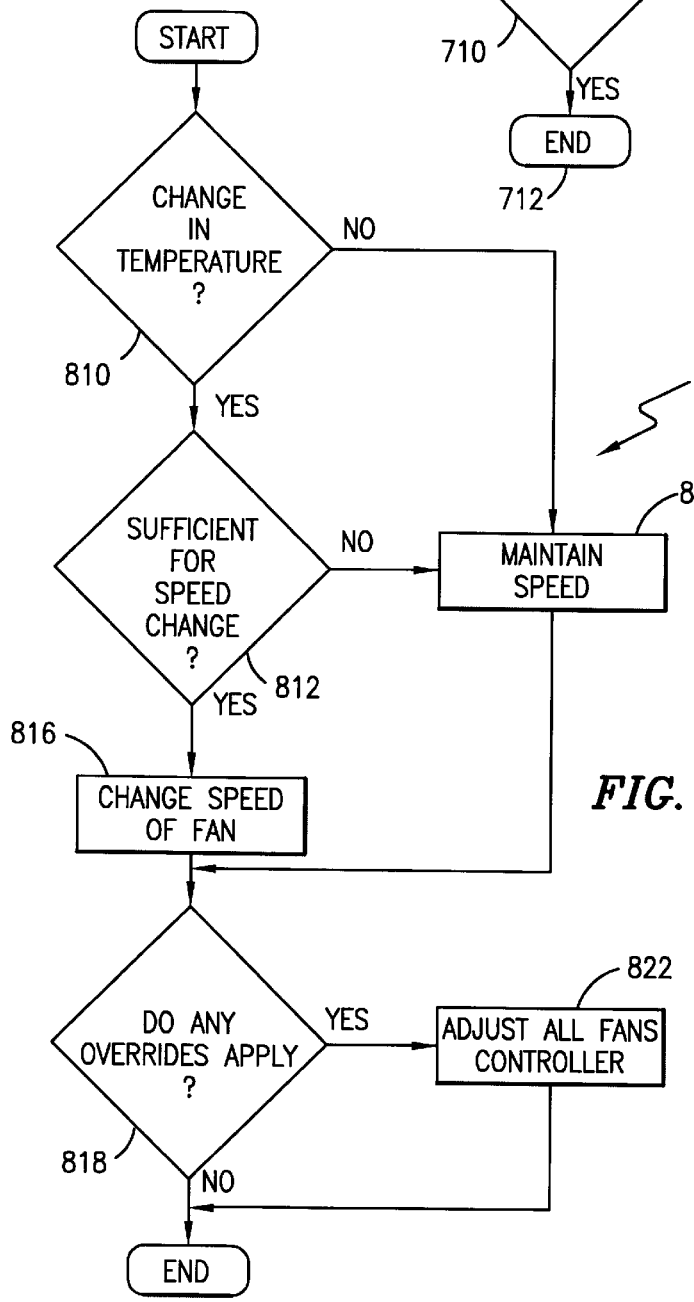
FIG. 8 is a flow chart illustrating the steps performed by the operating system to monitor and adjust the fan speeds for temperature fluctuations in the computer system.

Referring now to FIG. 8, there is illustrated a flow chart 800 illustrating the steps performed by the operating system, in communication with the fan control board 144, to monitor the temperature sensors and adjust the fan speed. This procedure runs at selected time intervals to monitor the temperature sensors in the computer system, or can be initiated by an interrupt generated by a fan. As depicted by step 810, a determination is made as to whether there has been any change in temperature as measured by one of the temperature sensors since the last time the procedure was executed. If a determination is made that there was no change in temperature, the 'no' path is followed to step 814, and the current fan speed of both operating fans is maintained. If, however, a determination is made that there has been a temperature change, the 'yes' path is followed to step 812. During step 812, a determination is made as to whether the change in temperature is sufficient to require a change in the fan speed. If the determination is made that the change in temperature is not sufficient to change the fan speed, the 'no' path is followed to step 814 and the current fan speed of both fans is maintained. If a determination is made that the change in temperature is sufficient to require a change in fan speed, the 'yes' path is followed to step 816 where the speed of both operating fans, the I/O fan and the processors fan, is changed. Subsequent to steps 814 and 816, step 818 is performed to determine if there exists any critical conditions or any overrides. If the determination is made that there exists a critical condition/override, the 'yes' path is followed and both fans are set to maximum speed. If the determination is made that there is not critical conditions/overrides, the 'no' path is followed, no further fan speed changes occur, and the procedure ends.

Figure 9:
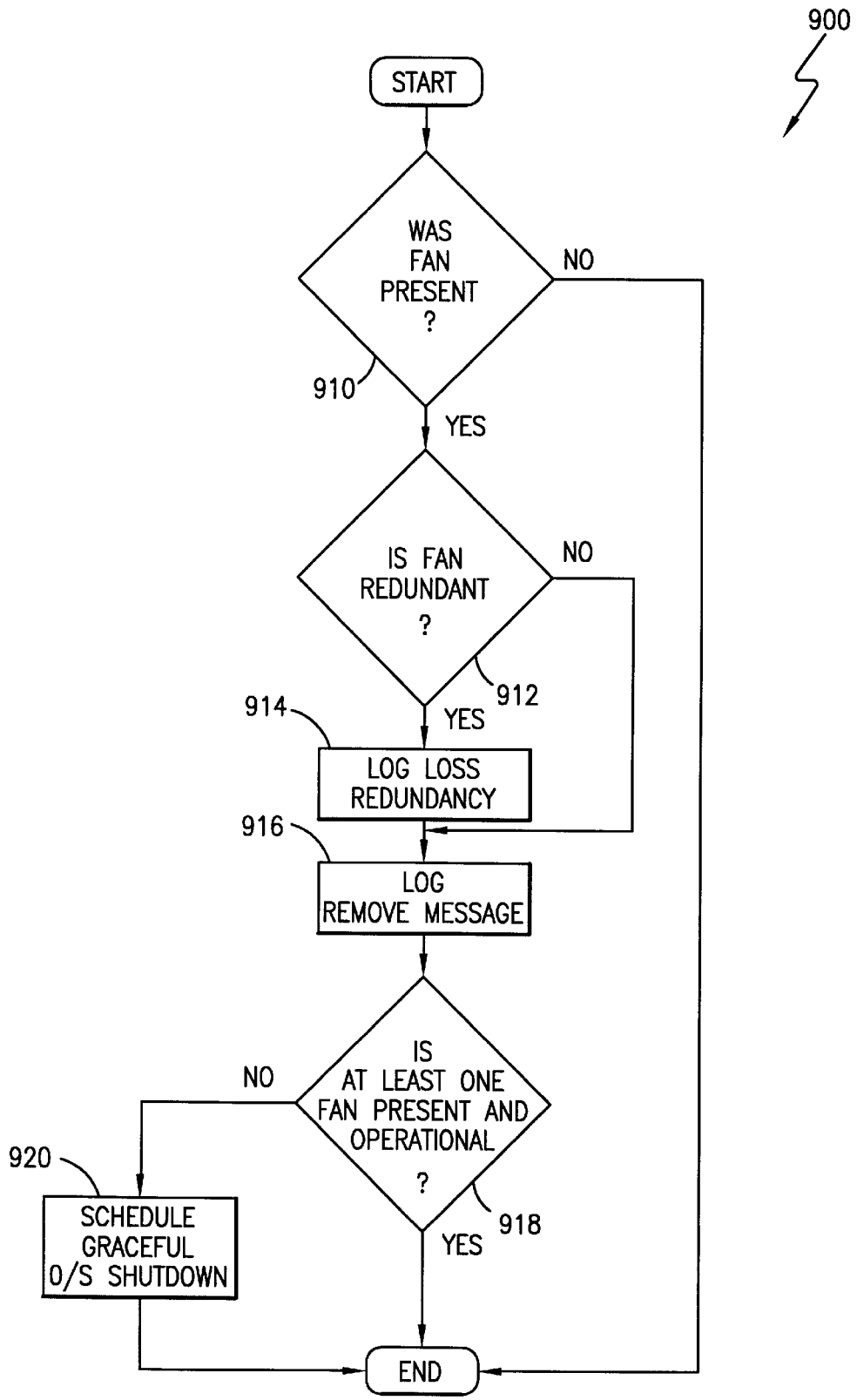
FIG. 9 is a flow chart illustrating the steps performed by the operating system upon the removal of a fan unit from a computer system utilizing the present invention.

Referring now to FIG. 9, there is illustrated a flow chart 900 illustrating the steps performed by the operating system in communication with the fan control board 144 to check for and identify the removal of a fan from the computer system. This procedure runs at selected time intervals and for each of the fan slots. Additionally, the procedure can be initiated by an interrupt generated by the fan when removed from the system. At the beginning of the procedure, as indicated by decision block 910, if the fan of interest was not present the last time the procedure was executed, the 'no' path is taken and the procedure ends. If, however, the fan of interest was present the last time the procedure was executed, the 'yes' path is followed to step 912, whereby a determination is made whether the removed fan was a redundant/secondary fan. If the determination is made that the removed fan was a redundant fan the 'yes' branch is followed to step 914 where the loss of the redundant is logged by the computer system. If the determination is made in step 912 that the removed fan was not redundant, the 'no' branch is followed, whereupon as indicated by step 916, the loss of the fan is logged by the computer system. Subsequently, as indicated by step 918, a determination is made whether there is at least one operational fan in the system. If the determination is made that there is at least one operational fan, the 'yes' path is followed and the procedure ends. If the determination is made that after the removal of the fan of interest, there are no operational fans present in the system, the 'no' path is followed, and as indicated by step 920, the operation system performs a graceful shutdown of the computer system.

Therefore, as can be appreciated, the present invention provides an cooling system for computer systems, such as high-end servers, and includes redundant, variable speed, responsive temperature, hot-pluggable cooling fans, and an air ramp for directing the air flow created by the cooling fans onto selected elements. The fans are controlled by a fan controller board, which is driven, at least in part, by the operating system of the computer. Each of the fans includes an attachment mechanism which facilitates the quick and safe insertion and removal of the fans from the computer system.

Although a preferred embodiment of the apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A computer system having a housing, at least one processor, and at least one input/output (I/O) component, said computer system comprising:

a first fan for moving air across the at least one processor;

a second fan for moving air across the at least one I/O component;

a plurality of temperature sensors with at least a first of said plurality of temperature sensors positioned proximate the at least one processor and with at least a second of said plurality of temperature sensor positioned proximate the at least one I/O component;

a controller coupled to said first fan, said second fan, and said plurality of temperature sensors, said controller for controlling the speed of said first fan and said second fan in response to one of said first of said plurality of temperature sensors and said second of said plurality of temperature sensors; and an air concentrator positioned within the housing for directing at least a portion of the moving air from the first fan across the at least one processor.

2. The computer system as recited in claim 1, and further comprising:

a first redundant fan positioned proximate said first fan for moving air across the at least one processor at select periods of time;

a second redundant fan positioned proximate said second fan for moving air across the at least one I/O component at select periods of time; and said controller further coupled to said first redundant fan and to said second redundant fan, said controller further for controlling the operation of said first redundant fan and said second redundant fan.

3. The computer system as recited in claim 2, wherein at least one of said first fan, said first redundant fan, said second fan, and said second redundant fan is hot-pluggable.

4. The computer system as recited in claim 3, and further comprising means for securing at least one of said first fan, said first redundant fan, said second fan, and said second redundant fan within the housing, said securing means including a spring lever coupled to one of said first fan, said first redundant fan, said second fan, and said second redundant fan, said spring lever for releasably latching to at least a portion of the housing.

5. The computer system as recited in claim 4, and further comprising means for removing at least one of said first fan, said first redundant fan, said second fan, and said second redundant fan, said removing means including a strap coupled to one of said first fan, said first redundant fan, said second fan, and said second redundant fan so as to allow a user to grasp said strap and said spring lever with one hand to facilitate the disengaging of said spring lever from the housing.

6. The computer system as recited in claim 1, wherein said air concentrator is positioned within the housing proximate the at least one processor.

7. The computer system as recited in claim 6, wherein said air concentrator includes a ramp.

8. The computer system as recited in claim 6, and further including an operating system in communication with said controller, said operating system for controlling at least a portion of the operation of said controller.

9. The computer system as recited in claim 8, wherein said controller further for detecting the removal and insertion of at least one of said first fan, said first redundant fan, said second fan, and said second redundant fan.

10. The computer system as recited in claim 9, wherein said controller bypasses said operating system during selected periods.

11. In a computer system having a plurality of processors and a plurality of input/output (I/O) components, a cooling system for dissipating heat generated by the plurality of processors and the plurality of I/O components, said cooling system comprising:

a first set of fans for generating a flow of air to be directed across the plurality of processors;

a second set of fans for generating a flow of air to be directed across the plurality of I/O components;

a plurality of temperature sensors, with at least a first of said plurality of temperature sensors positioned proximate at least one the plurality of processors and with at least a second of said plurality of temperature sensors positioned proximate at least one of the plurality of I/O components;

a controller coupled to said first set of fans, said second set of fans, and said plurality of temperature sensors, said controller for controlling the speed of said first set of fans and said second set of fans in response to one of said first of said plurality of temperature sensors and said second of said plurality of temperature sensors; and an air concentrator positioned proximate at least one of the plurality of processors, said air concentrator for directing at least a portion of the flow of air generated by said first set of fans over the at least one of the plurality of processors.

12. The cooling system as recited in claim 11, wherein said first set of fans includes a primary fan and a redundant fan.

13. The cooling system as recited in claim 12, wherein said second set of fans includes a primary fan and a redundant fan.

14. The cooling system as recited in claim 13, wherein each of said primary fan and said redundant fan of said first set of fans and each of said primary fan and said redundant fan of said second set of fans is hot-pluggable.

15. The cooling system as recited in claim 14, wherein each of said primary fan and said redundant fan of said first set of fans and each of said primary fan and said redundant fan of said second set of fans includes a spring lever latch mechanism for securement thereof within the computer system.

16. The cooling system as recited in claim 15, wherein each of said primary fan and said redundant fan of said first set of fans and each of said primary fan and said redundant fan of said second set of fans includes a non-conductive nylon strap attached thereto for facilitating the insertion and removal of said first set of fans and said second set of fans from the computer system.

17. The cooling system as recited in claim 16, wherein said air concentrator includes a ramp.

18. The cooling system as recited in claim 17, wherein each of said primary fan and said redundant fan of said first set of fans and each of said primary fan and said redundant fan of said second set of fans include a fault indicator.

19. A method for cooling multiple processors and multiple input/output (I/O) components within a computer system, said method comprising the steps of:

generating air flow over the I/O components with a first fan operating at a first rate;

generating air flow over the processors with a second fan operating at a first rate;

monitoring the temperature within the computer system proximate the I/O components;

monitoring the temperature within the computer system proximate the processors;

generating air flow over the I/O components with the first fan operating at a second rate in response to a change in temperature by a select amount detected in one of said steps of monitoring the temperature within the computer system proximate the I/O components and monitoring the temperature within the computer system proximate the processors;

generating air flow over the processors with the second fan operating at a second rate in response to a change in temperature by a select amount detected in one of said steps of monitoring the temperature within the computer system proximate the I/O components and monitoring the temperature within the computer system proximate the processors; and concentrating the air flow generated by the second fan over at least one of the processors with an air ramp.

20. The method as recited in claim 19, and further comprising the steps of:

monitoring the functionality of the first fan and the second fan;

generating air flow over the I/O components with a first redundant fan in response to the detection of a nonfunctional first fan during said step of monitoring the functionality of the first fan and the second fan; and generating air flow over the processors with a second redundant fan in response to the detection of a nonfunctional second fan during said step of monitoring the functionality of the first fan and the second fan.

21. The method as recited in claim 20, and further comprising the step of performing a graceful shut-down of the computer system controlled by the operating system in response to the detection of a nonfunctional first fan and a nonfunctional second fan during said step of monitoring the functionality of the first fan and the second fan.

22. The method as recited in claim 19, and further comprising the steps of:

monitoring the presence of the first fan and the second fan within the computer system; and performing a graceful shut-down of the computer system controlled by the operating system in response to the determination that both the first fan and the second fan are not present within the computer system.

* * * * *